United States Patent
Tsorng et al.

(10) Patent No.: US 12,484,179 B2
(45) Date of Patent: Nov. 25, 2025

(54) CONFIGURABLE RACK ASSEMBLY

(71) Applicant: Quanta Computer Inc., Taoyuan (TW)

(72) Inventors: Yaw-Tzorng Tsorng, Taoyuan (TW); Ming-Lung Wang, Taoyuan (TW); Jia-Lin Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 142 days.

(21) Appl. No.: 18/609,646

(22) Filed: Mar. 19, 2024

(65) Prior Publication Data

US 2025/0301593 A1  Sep. 25, 2025

(51) Int. Cl.
*H05K 7/14* (2006.01)
*H05K 7/18* (2006.01)

(52) U.S. Cl.
CPC ........... *H05K 7/1488* (2013.01); *H05K 7/183* (2013.01)

(58) Field of Classification Search
CPC ....................................................... H05K 7/186
See application file for complete search history.

(56) References Cited

U.S. PATENT DOCUMENTS

| 2009/0178983 | A1* | 7/2009 | Green | H05K 7/186 |
| | | | | 211/13.1 |
| 2019/0246513 | A1* | 8/2019 | Chen | A47B 81/00 |

FOREIGN PATENT DOCUMENTS

| CA | 2462039 | A1 | 9/2004 |
| CN | 1592556 | A | 3/2005 |
| CN | 113179677 | A | 7/2021 |
| TW | I721260 | B | 3/2021 |
| WO | 2023000575 | A1 | 1/2023 |

OTHER PUBLICATIONS

TW Office Action for Application No. 113127323 mailed Feb. 13, 2025, w/ First Office Action Summary, 7 pp.
TW Search Report for Application No. 113127323 mailed Feb. 13, 2025, w/ First Office Action, 1 p.

* cited by examiner

*Primary Examiner* — Jerry Wu
(74) *Attorney, Agent, or Firm* — NIXON PEABODY LLP

(57) ABSTRACT

A rack assembly for a computing system is disclosed. The rack assembly includes a rack frame, a vertical frame movably fixed within the rack frame, and a pair of brackets removably coupled to the vertical frame and the rack frame. The vertical frame is movable between a first position and a second position when the pair of brackets are uncoupled from the vertical frame and the rack frame. A base of the rack frame has a first hole configured to place the vertical frame in the first position and a second hole configured to place the vertical frame in the second position. The rack assembly is configured to receive a first type of computing device when the vertical frame is in the first position and receive a second type of computing device when the vertical frame is in the second position.

18 Claims, 13 Drawing Sheets

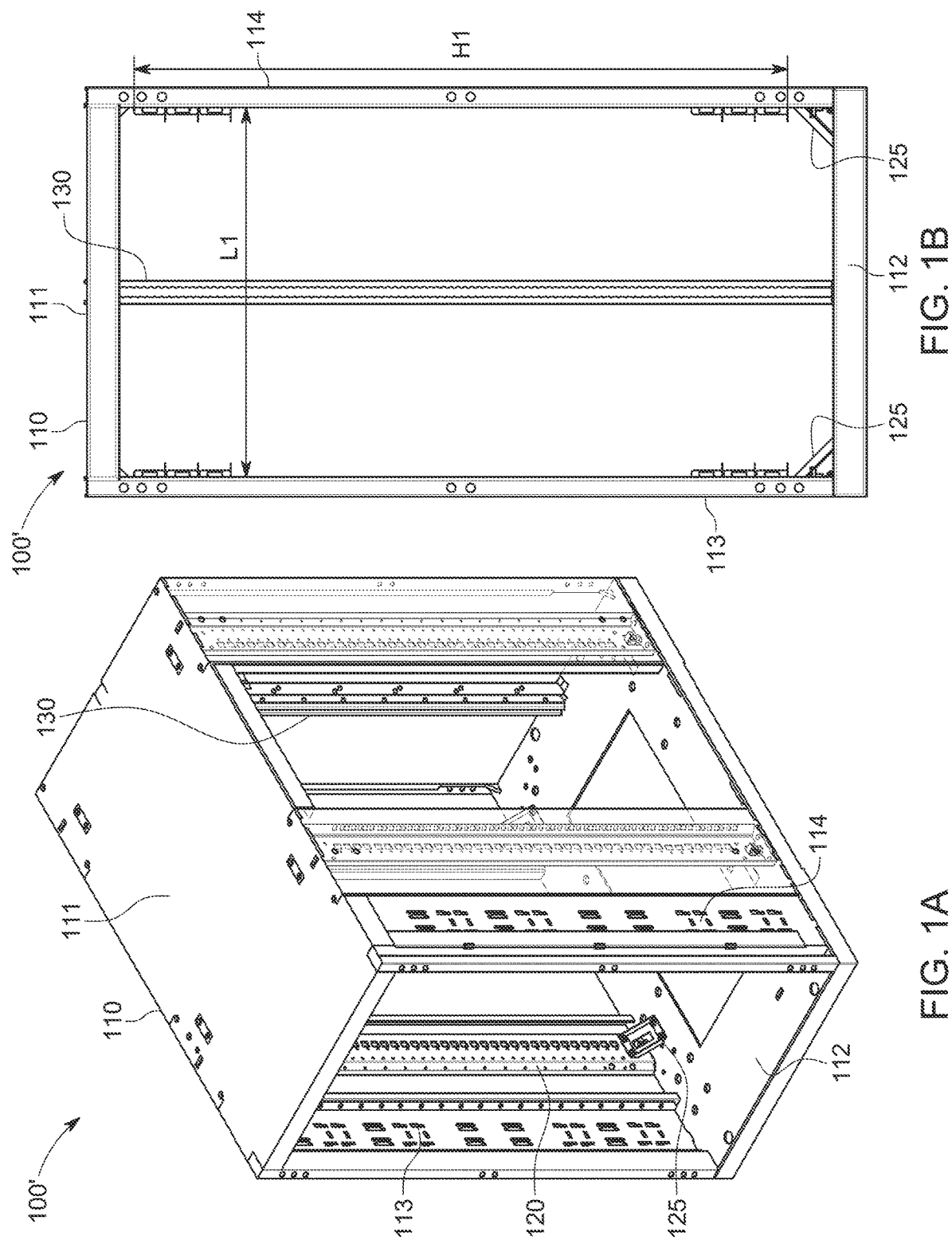

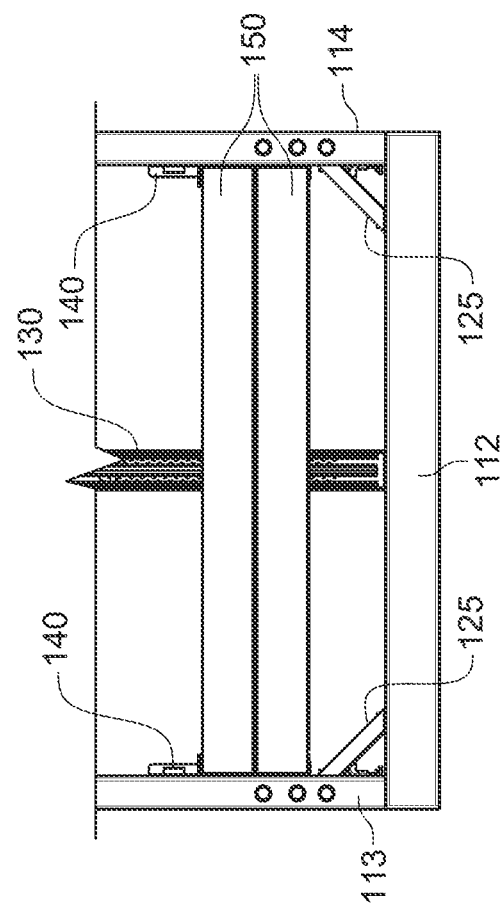
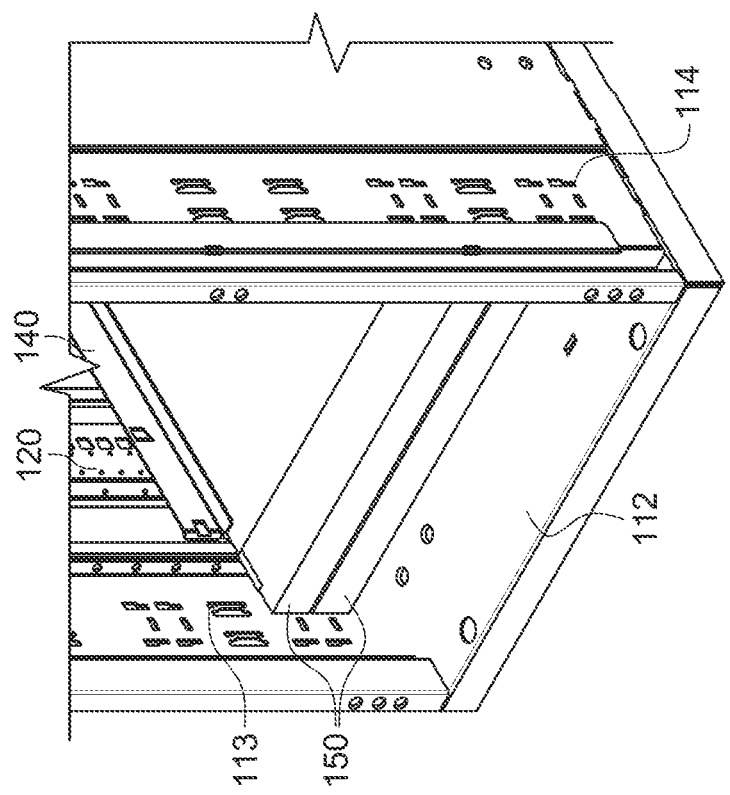
FIG. 2A
FIG. 2B

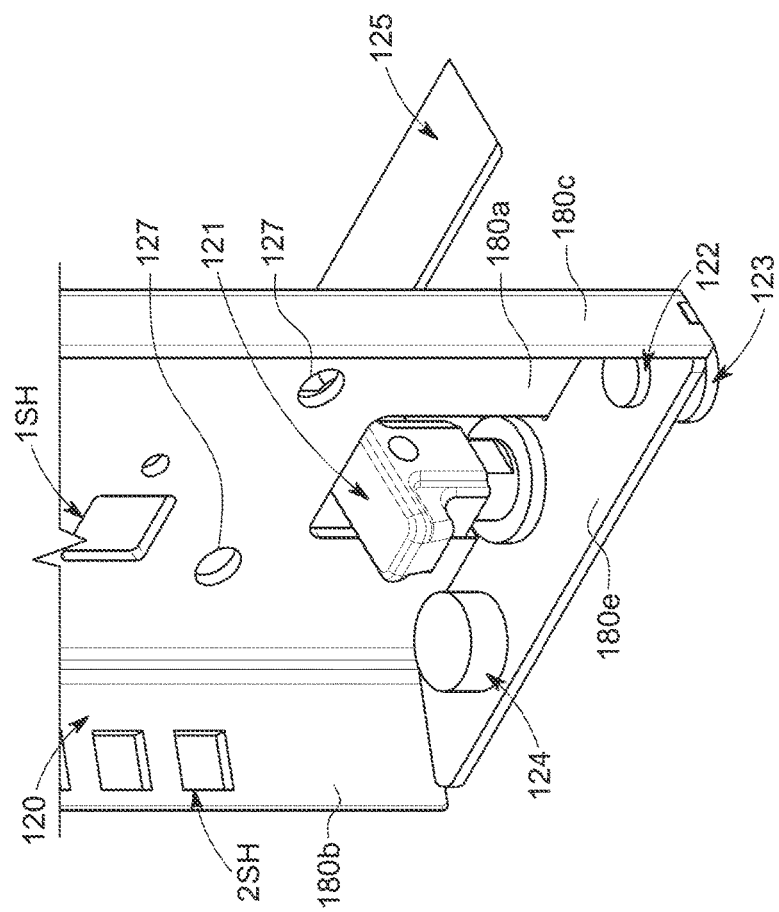
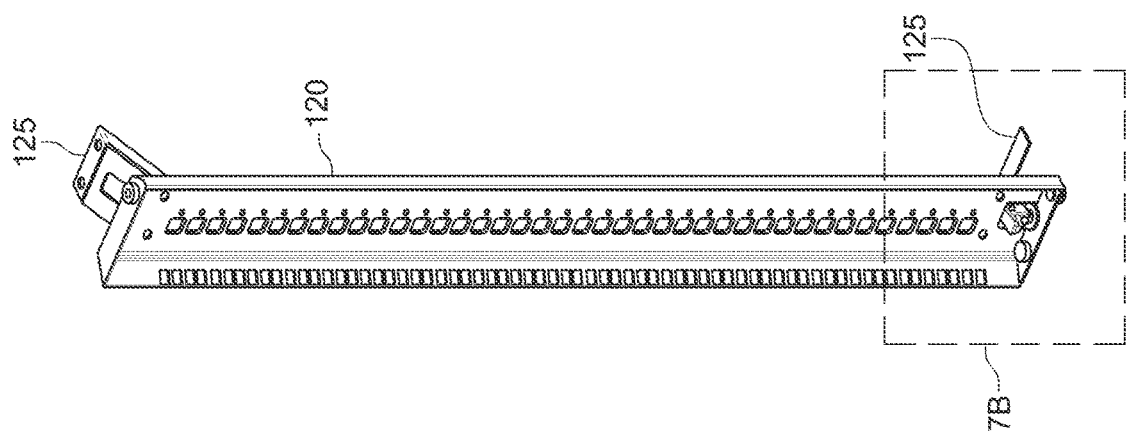
FIG. 7B
FIG. 7A

CONFIGURABLE RACK ASSEMBLY

FIELD OF THE INVENTION

The present invention relates generally to a rack assembly for a computing system, and more specifically, to a rack assembly configurable to receive a first computing device having first specifications and a second computing device having second specifications.

BACKGROUND OF THE INVENTION

The Open Compute Project (OCP) Foundation was established in 2011 with the goal of leveraging the advantages of open source and collaborative efforts to innovate hardware architecture. The Open Rack Standard is a subproject under the OCP that focuses on specifications for server racks and power supplies, and it has currently been updated to the third edition. Before the Open Rack Standard, the prevailing specification on the market was the Electronic Industries Alliance (EIA) standard. With the promotion of the OCP, there is an increasing adoption of server products that comply with the Open Rack Standard in the market. Data centers may use servers based on both specifications simultaneously. However, servers adhering to different specifications cannot share the same rack, potentially leading to situations where there is a shortage of racks for one specification while racks for the other specification remain unused.

Therefore, a need exists for solving the problem of incompatibility of a rack assembly with servers having different specifications. A need also exists for providing an easy and convenient mechanism to configure a rack assembly to accommodate multiple specifications.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a rack assembly for a computing system is disclosed. According to various embodiments, the rack assembly includes a rack frame configured to receive a plurality of computing devices and a plurality of vertical frames movably fixed to the rack frame. The plurality of computing devices includes a first computing device and a second computing device, the first computing device having first specifications in accordance with a first industry standard, the second computing device having second specifications in accordance with a second industry standard, the first industry standard being incompatible with the second industry standard. The plurality of vertical frames is configured to attach any computing device of the plurality of computing devices to the rack frame, each vertical frame of the plurality of vertical frames being movably fixed to the rack frame via a pair of brackets. The pair of brackets includes a base bracket immovably coupling, in a respective locked position, a lower end of the vertical frame to a base of the rack frame, and a top bracket immovably coupling, in a respective locked position, an upper end of the vertical frame to a top side of the rack frame. The vertical frame is movable between a first position and a second position along the rack frame when each of the base bracket and the top bracket is in a respective unlocked position. The first position accommodates the first specifications of the first industry standard, and the second position accommodates the second specifications of the second industry standard.

In various embodiments, the vertical frame is in the first position when the base bracket is coupled to a first area of the base of the rack frame and when the top bracket is coupled to a first area of the top side of the rack frame. The vertical frame is in the second position when the base bracket is coupled to a second area of the base of the rack frame and when the top bracket is coupled to a second area of the top side of the rack frame.

In various embodiments, the base bracket has a first pair of through-holes configured to receive a first pair of fasteners. The first pair of fasteners are fastened to a pair of receiving holes formed at the lower end of the vertical frame. The base bracket has a second pair of through-holes configured to receive a second pair of fasteners.

In various embodiments, the second pair of fasteners are fastened to a first pair of receiving holes or a second pair of receiving holes formed on the base of the rack frame. The first pair of receiving holes are formed at the first area of the base of the rack frame. The second pair of receiving holes are formed at the second area of the base of the rack frame.

In various embodiments, the top bracket has a third pair of through-holes configured to receive a third pair of fasteners. The third pair of fasteners are fastened to a pair of receiving holes formed at the upper end of the vertical frame. The top bracket has a fourth pair of through-holes configured to receive a fourth pair of fasteners.

In various embodiments, the fourth pair of fasteners are fastened to a third pair of receiving holes or a fourth pair of receiving holes formed on the top side of the rack frame. The third pair of receiving holes are formed at the first area of the top side of the rack frame. The fourth pair of receiving holes are formed at the second area of the top side of the rack frame.

In various embodiments, the vertical frame is in the first position when the second pair of fasteners are fastened to the first pair of receiving holes formed on the base of the rack frame and when the fourth pair of fasteners are fastened to the third pair of receiving holes formed on the top side of the rack frame.

In various embodiments, the vertical frame is in the second position when the second pair of fasteners are fastened to the second pair of receiving holes formed on the base of the rack frame and when the fourth pair of fasteners are fastened to the fourth pair of receiving holes formed on the top side of the rack frame.

In various embodiments, each of the plurality of vertical frames has a first planar surface; a second planar surface extending from a first side edge of the first planar surface; a third planar surface extending from a second side edge of the first planar surface; a top planar surface perpendicularly extending from a top edge of the first planar surface; and a bottom planar surface perpendicularly extending from a bottom edge of the first planar surface. The top planar surface and the bottom planar surface are parallel.

In various embodiments, a first angle between the first planar surface and the second planar surface is greater than 90 degrees and a second angle between the first planar surface and the third planar surface is greater than 90 degrees. The second planar surface and the third planar surface are not parallel.

In various embodiments, the first planar surface has a first plurality of mounting apertures arranged vertically, the first plurality of mounting apertures being configured for coupling of a rail to the rack frame. The second planar surface has a second plurality of mounting apertures arranged vertically, the second plurality of mounting apertures being configured for coupling of a rail to the rack frame.

In various embodiments, the first plurality of mounting apertures are used to receive the first computing device, and the second plurality of mounting apertures are used to receive the second computing device.

In various embodiments, a number of the first plurality of mounting apertures is less than a number of the second plurality of mounting apertures. A first size of each of the first plurality of mounting apertures is same. A second size of each of the second plurality of mounting apertures is same. The first size is greater than the second size.

In various embodiments, each of the plurality of vertical frames further has a plunger coupled to the bottom planar surface and configured to be inserted into one of two plunger receiving holes formed on the base of the rack frame. The vertical frame is in the first position when the plunger is inserted into a first plunger receiving hole and the vertical frame is in the second position when the plunger is inserted into a second plunger receiving hole.

In various embodiments, each of the plurality of vertical frames further has a first axis coupled to the bottom planar surface, a first axis roller coupled to the first axis, a second axis coupled to the top planar surface, and a second axis roller coupled to the second axis. The base of the rack frame has a first elongated slot, the first elongated slot having a first position and a second position. The top of the rack frame has a second elongated slot, the second elongated slot having a first position and a second position. The first axis roller is movable between the first position and the second position of the first elongated slot when the base bracket is uncoupled from the lower end of the vertical frame and the base of the rack frame and when the top bracket is uncoupled from the upper end of the vertical frame and the top side of the rack frame. The second axis roller is movable between the first position and the second position of the second elongated slot when the base bracket is uncoupled from the lower end of the vertical frame and the base of the rack frame and when the top bracket is uncoupled from the upper end of the vertical frame and the top side of the rack frame.

In various embodiments, the vertical frame is in the first position when the first axis roller is at the first position of the first elongated slot and when the second axis roller is at the first position of the second elongated slot. The vertical frame is in the second position when the first axis roller is at the second position of the first elongated slot and when the second axis roller is at the second position of the second elongated slot.

In various embodiments, each of the plurality of vertical frames further has a ball roller couple to the bottom planar surface and configured to support movement of the vertical frame when the vertical frame is moved between the first position and the second position, the ball roller contacting the base of the rack frame.

According to other aspects of the present disclosure, a server system is disclosed. According to various embodiments, the server system includes a rack assembly configured to receive a plurality of computing devices including a first computing device and a second computing device, the first computing device having first specifications in accordance with a first industry standard, the second computing device having second specifications in accordance with a second industry standard, the first industry standard being incompatible with the second industry standard. The rack assembly includes a rack frame; and a plurality of vertical frames movably fixed to the rack frame, the plurality of vertical frames being configured to attach any computing device of the plurality of computing devices to the rack frame. Each vertical frame of the plurality of vertical frames is movably fixed to the rack frame via a pair of brackets. The pair of brackets includes a base bracket immovably coupling, in a respective locked position, a lower end of the vertical frame to a base of the rack frame; and a top bracket immovably coupling, in a respective locked position, an upper end of the vertical frame to a top side of the rack frame. The vertical frame is movable between a first position and a second position along the rack frame when each of the base bracket and the top bracket is in a respective unlocked position, the first position accommodating the first specifications of the first industry standard, the second position accommodating the second specifications of the second industry standard.

In various embodiments, each of the base and the top side of the rack frame has an elongated slot within which an axis roller coupled to the vertical frame is movable, the vertical frame being in the first position when the axis roller is at a first position of the slot, and the vertical frame being in the second position when the axis roller is at a second position of the slot.

In various embodiments, each of the plurality of vertical frames has a plunger configured to be inserted into one of two plunger receiving holes formed on the base of the rack frame such that the vertical frame is in the first position when the plunger is inserted into a first plunger receiving hole and the vertical frame is in the second position when the plunger is inserted into a second plunger receiving hole.

In various embodiments, each of the plurality of vertical frames further has a ball roller couple to the vertical frame and configured to support movement of the vertical frame when the vertical frame is moved between the first position and the second position, the ball roller contacting the base of the rack frame.

According to other aspects of the present disclosure, a rack assembly for a computing system is disclosed. According to various embodiments, the rack assembly includes a rack frame having a top, a base, a front, a rear, and opposing left and right sides; a vertical frame movably fixed within the rack frame; and a pair of brackets. The pair of brackets includes a base bracket removably coupled to a lower end of the vertical frame and the base of the rack frame; and a top bracket removably coupled to an upper end of the vertical frame and the top of the rack frame. The vertical frame is movable between a first position and a second position when the pair of brackets are uncoupled from the vertical frame and the rack frame. The base of the rack frame has a first hole configured to place the vertical frame in the first position and a second hole configured to place the vertical frame in the second position. The rack assembly is configured to receive a first type of computing device when the vertical frame is in the first position and receive a second type of computing device when the vertical frame is in the second position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

FIG. 1A shows a perspective view of a rack assembly in a first configuration, according to certain aspects of the present disclosure.

FIG. 1B shows a front view of the rack assembly shown in FIG. 1A, according to certain aspects of the present disclosure.

FIG. 2A shows a partial perspective view of a rack assembly in a first configuration with a rail and computing devices, according to certain aspects of the present disclosure.

FIG. 2B shows a partial front view of the rack assembly shown in FIG. 2A, according to certain aspects of the present disclosure.

FIG. 7A shows a perspective view of a vertical frame, according to certain aspects of the present disclosure.

FIG. 7B shows a partial perspective view of the vertical frame shown in FIG. 7A, according to certain aspects of the present disclosure.

Figure 3B:
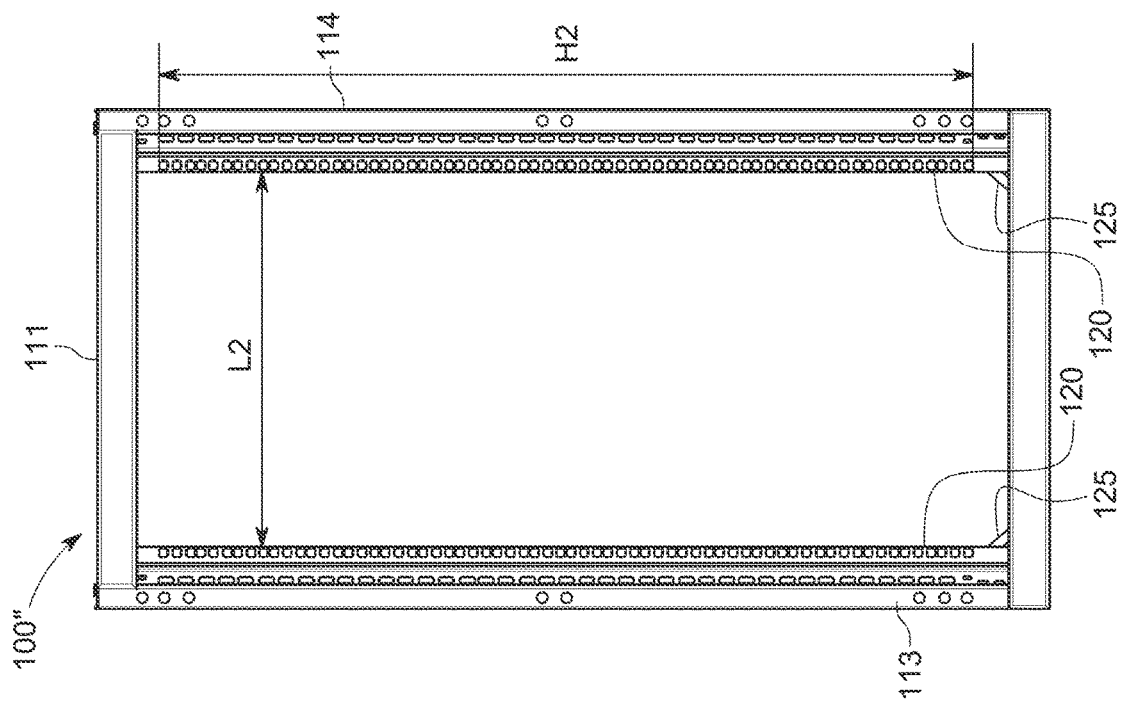
FIG. 3B shows a front view of the rack assembly shown in FIG. 3A, according to certain aspects of the present disclosure.

Elements in the figures are illustrated for simplicity and clarity and have not necessarily been drawn to scale. For example, the dimensions and/or relative positioning of some of the elements in the figures may be exaggerated relative to other elements to help improve understanding of various features.

While the present disclosure is susceptible to various modifications and alternative forms, specific implementations have been shown by way of example in the drawings and will be described in further detail herein. It should be understood, however, that the present disclosure is not intended to be limited to the particular forms disclosed. Rather, the present disclosure is to cover all modifications, equivalents, and alternatives falling within the spirit and scope of the present disclosure as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1A shows a perspective view of a rack assembly in a first configuration, according to certain aspects of the present disclosure. FIG. 1B shows a front view of the rack assembly shown in FIG. 1A, according to certain aspects of the present disclosure. FIG. 2A shows a partial perspective view of a rack assembly in a first configuration with a rail and computing devices, according to certain aspects of the present disclosure. FIG. 2B shows a partial front view of the rack assembly shown in FIG. 2A, according to certain aspects of the present disclosure.

The configuration of the rack assembly 100 can be changed from a first configuration to a second configuration and vice versa. The first configuration of the rack assembly 100' is exemplified in FIGS. 1A-2B, and the second configuration of the rack assembly 100" is exemplified in FIGS. 3A-4. A plurality of computing devices receivable by the rack assembly 100 includes a first computing device 150 and a second computing device 155. For example, the first computing device 150, shown in FIGS. 2A and 2B, has first specifications in accordance with a first industry standard, and the second computing device 155, shown in FIG. 4, has second specifications in accordance with a second industry standard. Further, the first industry standard is incompatible with the second industry standard.

Figure 5:
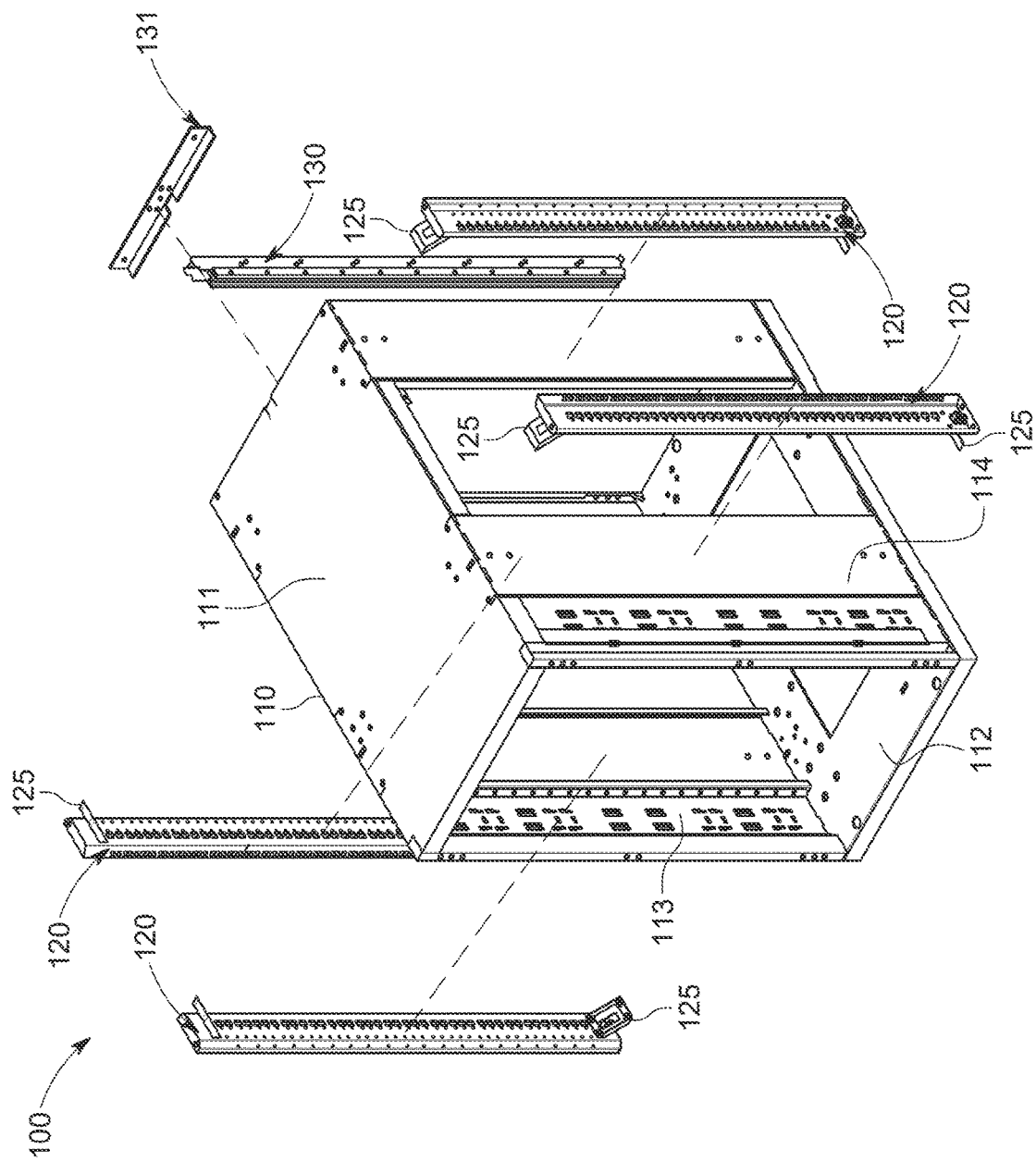
FIG. 5 shows an exploded perspective view of the rack assembly shown in FIG. 1A, according to certain aspects of the present disclosure.

Referring to FIGS. 1A and 1B, a rack assembly 100' for a computing system includes a rack frame 110 and a plurality of vertical frames 120. For example, a number of the vertical frames 120 is 4. However, in certain embodiments, the number of the vertical frames 120 is less than or greater than 4. Further, the rack assembly 100', which is in a first configuration, further includes a bus bar 130, as shown in FIGS. 1A, 1B, and 5. For example, the first configuration is according to the Open Rack version 3 (ORV3) specification. In various embodiments, the bus bar 130 is supplied with 48V DC by a shelf of power supplies which provides efficient conversion from the local (usually three-phase) AC mains supply. For example, an equipment bay is 21" or 538 millimeters (mm) wide. That is, referring to FIG. 1B, the width L1 of the equipment bay of the rack assembly in the first configuration is about 538 mm, 538 mm~about 540 mm, about 539.4 mm, or 539.4 mm. Further, for example, the height H1 of the equipment bay of the rack assembly 100 in the first configuration is 20 OU ref. However, the width L1 and heigh H1 of the equipment bay of the rack assembly 100' in the first configuration are not limited to the above indicated values, and they may be somewhat different.

Referring to FIGS. 2A and 2B, the rack assembly 100' or rack frame 110 is configured to receive a plurality of first computing devices 150 such as servers. For example, the first computing device 150 or IT equipment that fits into Open Rack, i.e., a rack frame 110 in a first configuration, is 21" or 538 mm wide. In various embodiments, the rack assembly 100' or rack frame 110 is further configured to receive at least one rail 140 configured to receive the first computing devices 150. The plurality of vertical frames 120 is movably fixed to the rack frame 110, and in FIGS. 2A and 2B, the vertical frames 120 are in the first position.

Figure 3A:
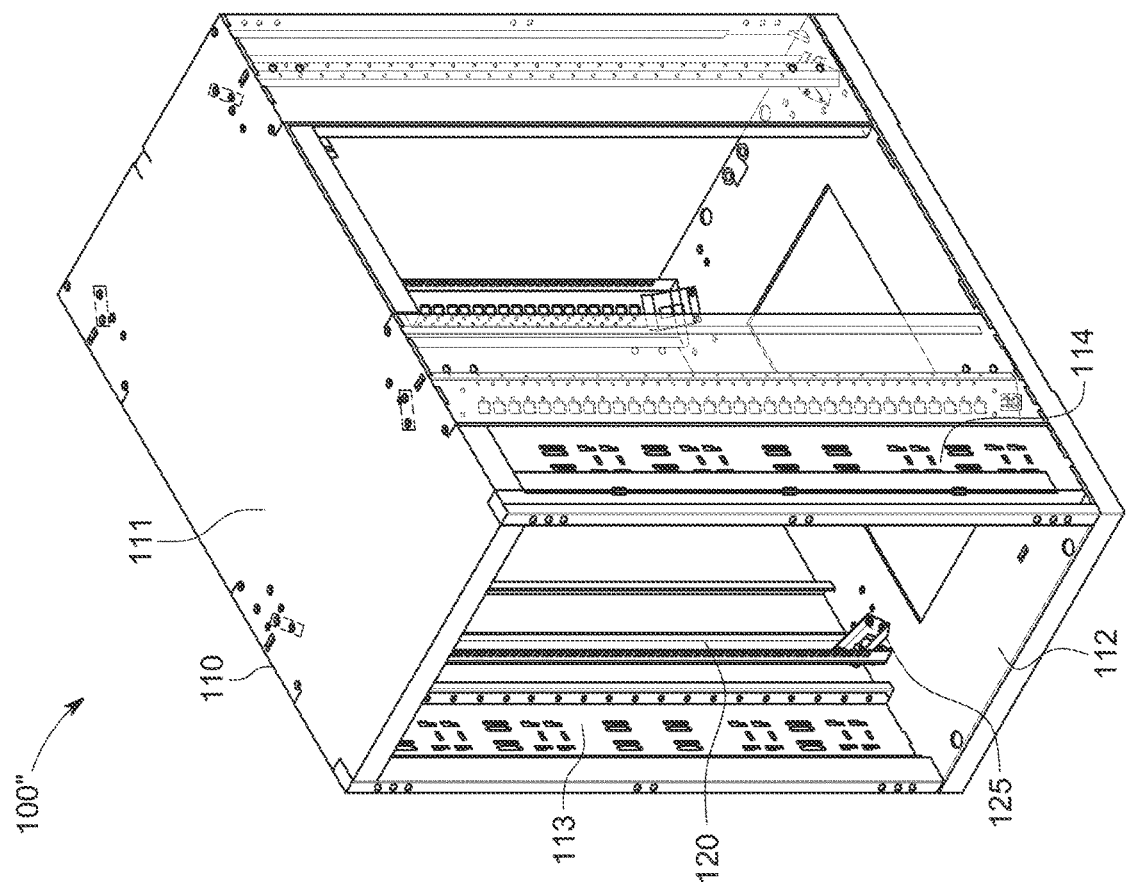
FIG. 3A shows a perspective view of a rack assembly in a second configuration, according to certain aspects of the present disclosure.
Figure 4:
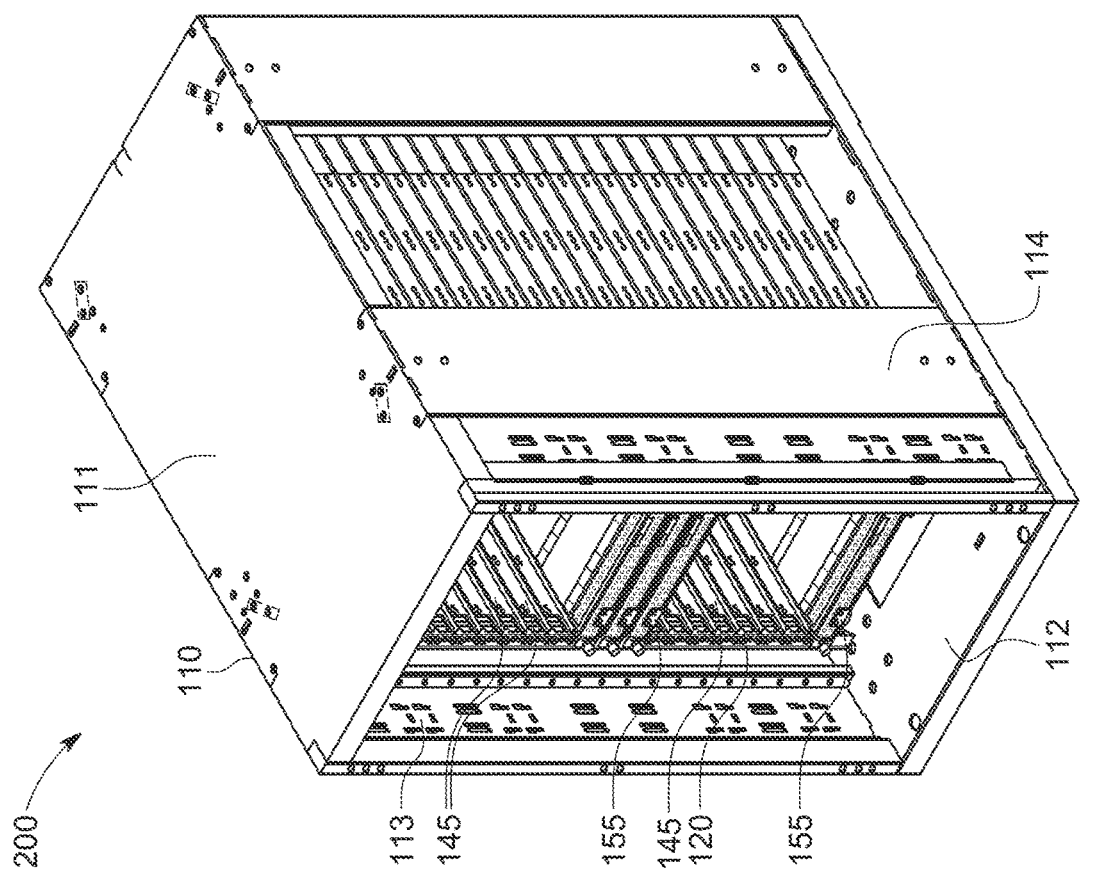
FIG. 4 shows a perspective view of a rack assembly in a second configuration with rails and computing devices, according to certain aspects of the present disclosure.

FIG. 3A shows a perspective view of a rack assembly in a second configuration, according to certain aspects of the present disclosure. FIG. 3B shows a front view of the rack assembly shown in FIG. 3A, according to certain aspects of the present disclosure. FIG. 4 shows a perspective view of a rack assembly in a second configuration with rails and computing devices, according to certain aspects of the present disclosure.

Referring to FIGS. 3A-4, a rack assembly 100" for a computing system includes a rack frame 110 and a plurality of vertical frames 120. For example, a number of the vertical frames 120 is 4, but the number is not limited thereto and may be less or greater than 4. Further, the rack assembly 100", which is in a second configuration, does not have a bus bar, contrary to the rack assembly 100' in the first configuration which is exemplified in FIGS. 1A-2B. For example, the second configuration is according to the EIA-310 rack specification. In various embodiments, each module has a front panel that is 19 inches (482.6 mm) wide. The 19-inch dimension includes the edges or ears that protrude from each side of the equipment, allowing the module to be fastened to the rack frame 110 with screws or bolts. Referring to FIG. 3B, the width L2 of the equipment bay of the rack assembly 100" in the second configuration is about 450 mm, or 450 mm. That is, the width L1 of the equipment bay of the rack assembly 100' in the first configuration is greater than the width L2 of the equipment bay of the rack assembly 100" in the second configuration. Further, for example, the height H2 of the equipment bay of the rack assembly 100" in the second configuration is 22RU ref. However, the width L2 and heigh H2 of the equipment bay of the rack assembly 100" in the second configuration are not limited to the above indicated values, and they may be somewhat different.

Referring to FIG. 4, the rack assembly 100" or rack frame 110 is configured to receive a plurality of second computing devices 155 such as servers. For example, the first computing device 150 has first specifications in accordance with a first industry standard, and the second computing device 155 has second specifications in accordance with a second industry standard. In general, the first industry standard is incompatible with the second industry standard. In various embodiments, the rack assembly 100" or rack frame 110 shown in FIG. 4 is further configured to receive at least one rail 145 configured to receive the second computing devices 155. The rail 140 used when the vertical frames 120 are in the first position or when the rack assembly 100' is in the first configuration is not the same as the rail 145 used when the vertical frames 120 are in the second position or when the rack assembly 100" is in the second configuration. The plurality of vertical frames 120 is movably fixed to the rack frame 110, and in FIG. 4, the vertical frames 120 are in the second position.

Since the rack assembly 100 can be configured as a first configuration or a second configuration, the plurality of vertical frames 120 is configured to attach any computing device of the plurality of computing devices 150, 155 to the rack frame 110 by being in an applicable configuration. FIG. 5 shows an exploded perspective view of the rack assembly shown in FIG. 1A, according to certain aspects of the present disclosure.

Figure 8A:
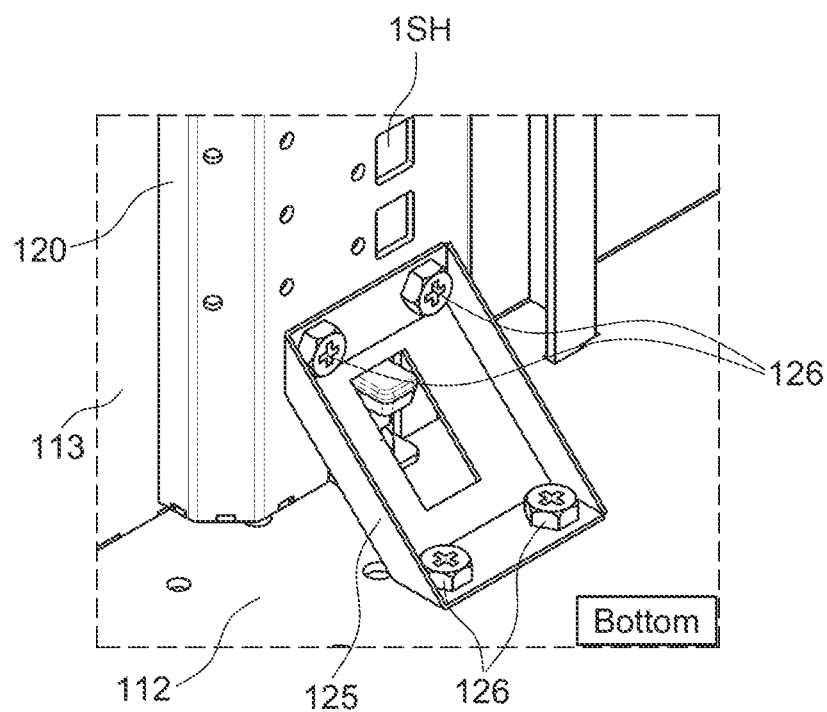
FIG. 8A shows a partial perspective view of a lower portion of a vertical frame fixed to a rack frame of a rack assembly in a first configuration, according to certain aspects of the present disclosure.
Figure 8B:
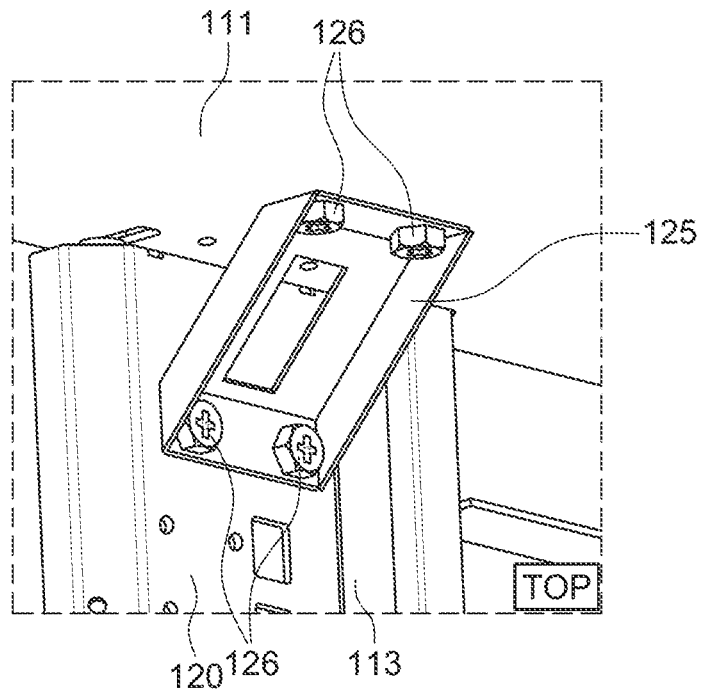
FIG. 8B shows a partial perspective view of an upper portion of the vertical frame shown in FIG. 8A, according to certain aspects of the present disclosure.
Figure 10A:
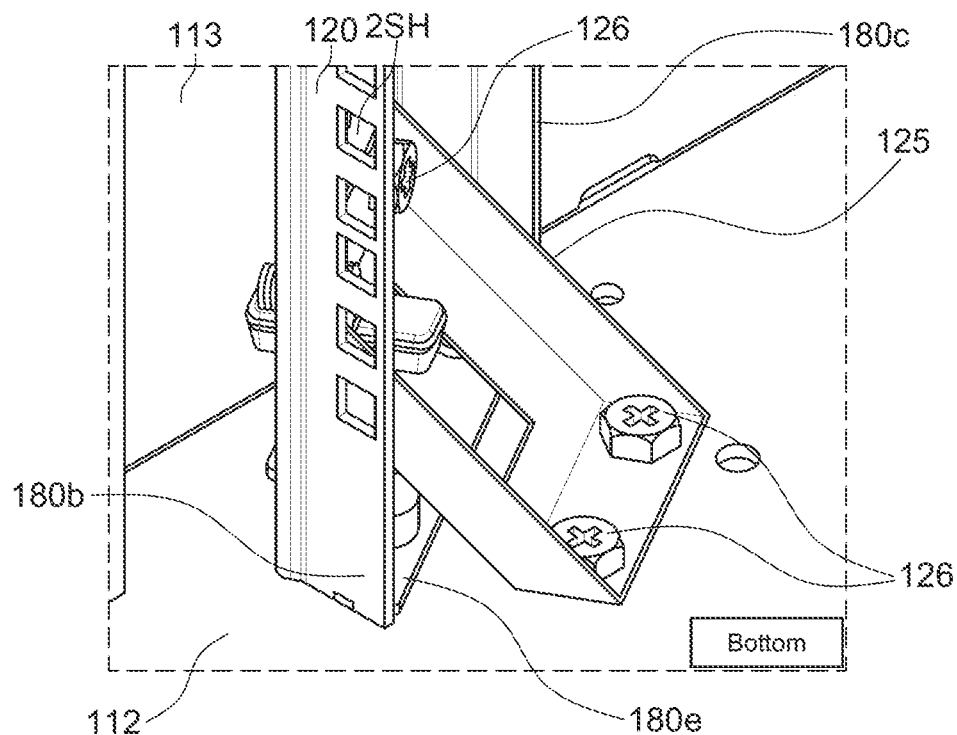
FIG. 10A shows a partial perspective view of a lower portion of a vertical frame fixed to a rack frame of a rack assembly in a second configuration, according to certain aspects of the present disclosure.
Figure 10B:
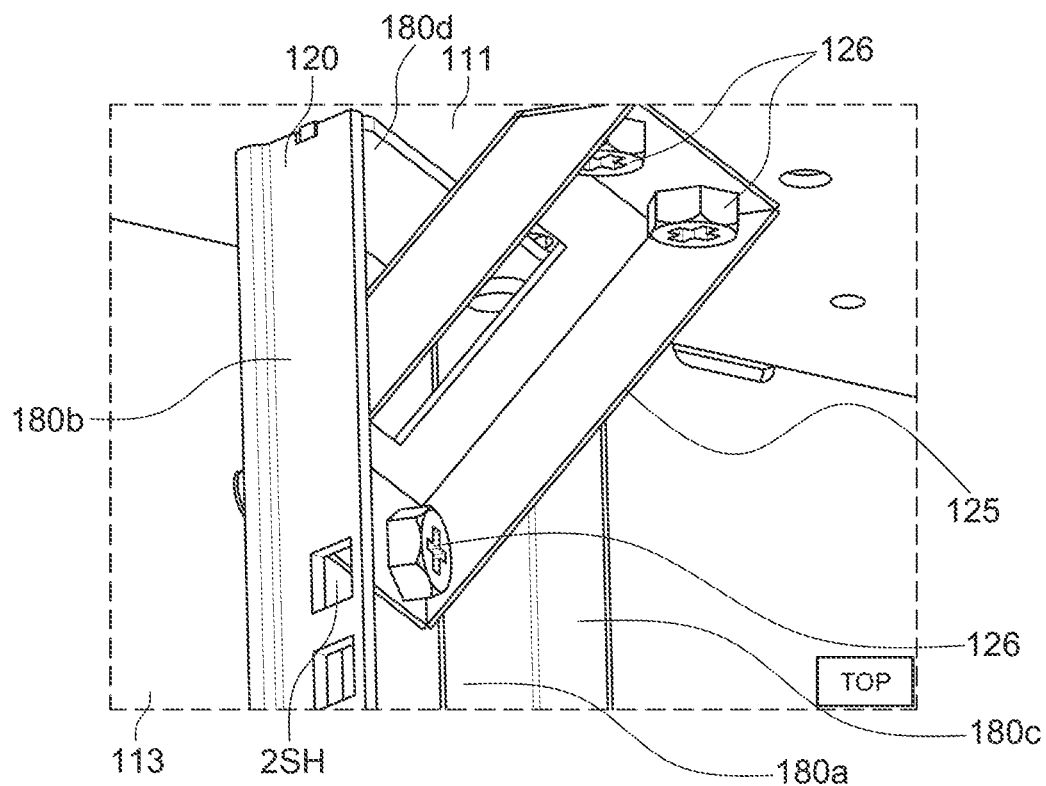
FIG. 10B shows a partial perspective view of an upper portion of the vertical frame shown in FIG. 10A, according to certain aspects of the present disclosure.

Referring to FIG. 5, each vertical frame 120 of the plurality of vertical frames is coupled to a pair of brackets 125. In various embodiments, the brackets 125 are made of metal. The vertical frame 120 is movably fixed to the rack frame 110 via the pair of brackets 125. The pair of brackets 125 includes a base bracket 125 immovably coupling, in a respective locked position, a lower end of the vertical frame 120 to a base 112 of the rack frame 110, as shown in FIGS. 8A and 10A. The pair of brackets 125 further includes a top bracket 125 immovably coupling, in a respective locked position, an upper end of the vertical frame 120 to a top side 111 of the rack frame 110, as shown in FIGS. 8B and 10B. In various embodiments, the base bracket 125 and the top bracket 125 are structurally the same. The vertical frame 120 is movable between a first position and a second position along the rack frame 110 when each of the base bracket 125 and the top bracket 125 is in a respective unlocked position. That is, the rack assembly 100 is in the first configuration when the vertical frame 120 is in the first position, as shown in FIGS. 1A-2B, and in the second configuration when the vertical frame 120 is in the second position, as shown in FIGS. 3A-4. The first position of the vertical frame 120 accommodates the first specifications of the first industry standard, and the second position of the vertical frame 120 accommodates the second specifications of the second industry standard.

Figure 6B:
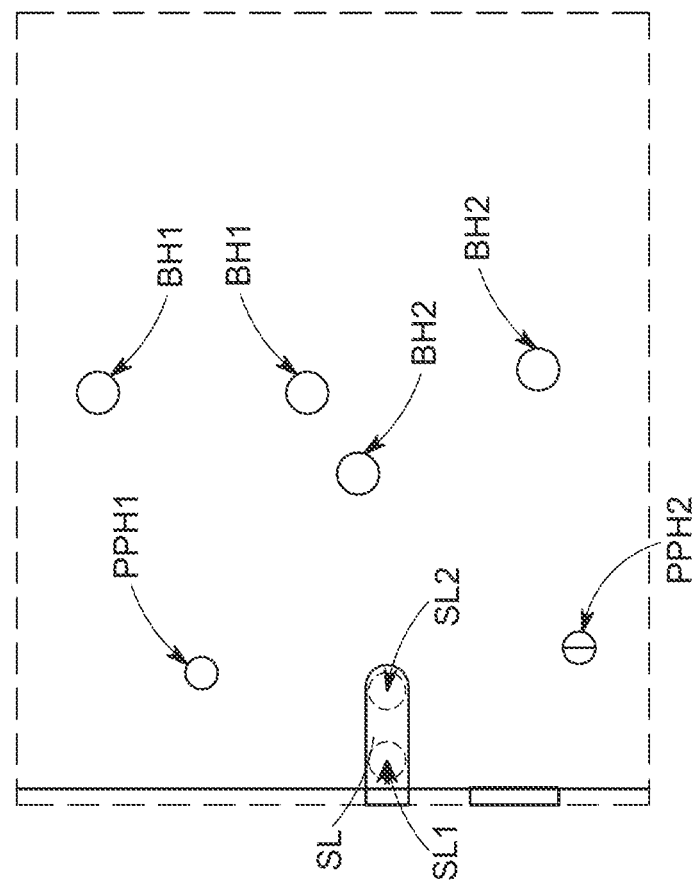
FIG. 6B shows a magnified view of a portion of the base of the rack assembly shown in FIG. 6A, according to certain aspects of the present disclosure.
Figure 6A:
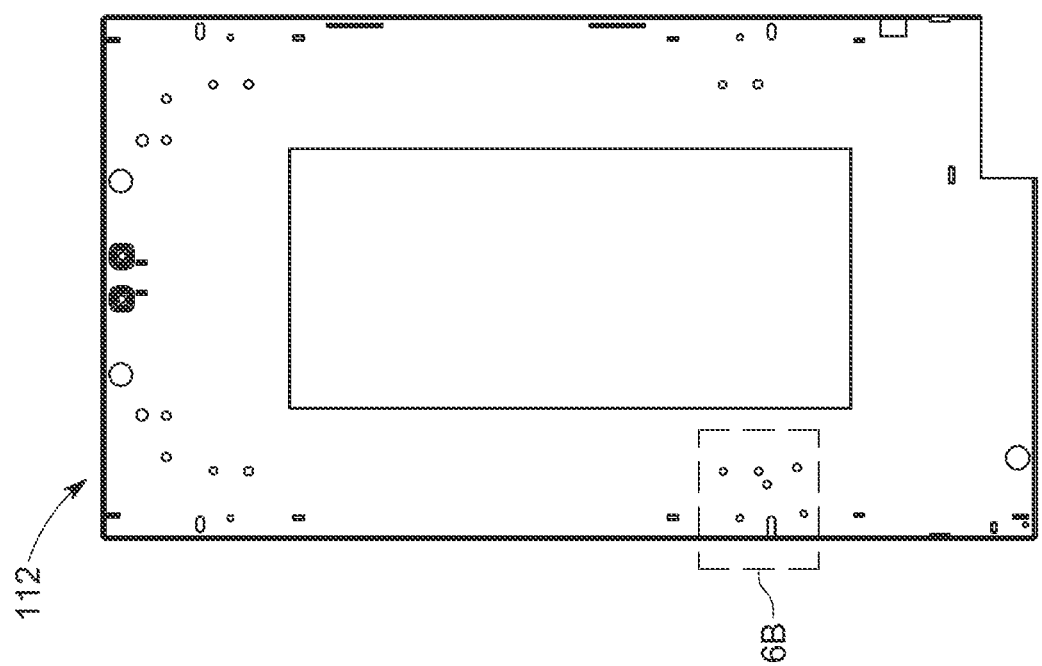
FIG. 6A shows a top view of a base of a rack assembly, according to certain aspects of the present disclosure.

FIG. 6A shows a top view of a base of a rack assembly, according to certain aspects of the present disclosure. FIG. 6B shows a magnified view of a portion of the base of the rack assembly shown in FIG. 6A, according to certain aspects of the present disclosure.

Referring to FIGS. 6A and 6B, the base 112 of the rack frame 110 has a plurality of holes. In various embodiments, the plurality of holes on the base 112 includes plunger position holes PPH1 and PPH2. In various embodiments, the plurality of holes on the base 112 further includes bracket holes BH1 and BH2. For example, there are a pair of bracket holes BH1 and a pair of bracket holes BH2, as shown in FIG. 6B.

In various embodiments, the vertical frame 120 is in the first position when the base bracket 125 is coupled to a first area of the base 112 of the rack frame 110, the first area being an area having BH1. Further, the vertical frame 120 is in the first position when the top bracket 125 is coupled to a first area of the top side 111 of the rack frame 110. The first area of the top side 111 has bracket holes (not shown in drawings) that correspond to BH1. The vertical frame 120 is in the second position when the base bracket 125 is coupled to a second area of the base 112 of the rack frame 110, the second area being an area having BH2. Further, the vertical frame 120 is in the second position when the top bracket 125 is coupled to a second area of the top side 111 of the rack frame 110. The second area of the top side 111 has bracket holes (not shown in drawings) that correspond to BH2.

FIG. 7A shows a perspective view of a vertical frame, according to certain aspects of the present disclosure. FIG. 7B shows a partial perspective view of a lower portion of the vertical frame shown in FIG. 7A, according to certain aspects of the present disclosure.

Referring to FIGS. 7A and 7B, a pair of base brackets 125 is coupled to the vertical frame 120, one base bracket 125 being coupled to a lower portion of the vertical frame 120 and the other base bracket 125 being coupled to an upper portion of the vertical frame 120. A series of first specification holes 1SH are formed on one side of the vertical frame 120 and a series of second specification holes 2SH are formed on another side of the vertical frame 120.

FIG. 8A shows a partial perspective view of a lower portion of a vertical frame fixed to a rack assembly in a first configuration, according to certain aspects of the present disclosure. FIG. 8B shows a partial perspective view of an upper portion of the vertical frame shown in FIG. 8A, according to certain aspects of the present disclosure. FIG. 10A shows a partial perspective view of a lower portion of a vertical frame fixed to a rack assembly in a second configuration, according to certain aspects of the present disclosure. FIG. 10B shows a partial perspective view of an upper portion of the vertical frame shown in FIG. 10A, according to certain aspects of the present disclosure.

Referring to FIGS. 8A and 10A, in various embodiments, the base bracket 125 has a first pair of through-holes (not shown in drawings) configured to receive a first pair of fasteners 126. The first pair of fasteners 126 are fastened to a pair of receiving holes 127 (shown in FIGS. 7C and 9A) formed at the lower end of the vertical frame 120. The base bracket 125 has a second pair of through-holes (not shown in drawings) configured to receive a second pair of fasteners 126. The second pair of fasteners 126 are fastened to a first pair of receiving holes or a second pair of receiving holes formed on the base 112 of the rack frame 110. The first pair of receiving holes, for example BH1 shown in FIG. 6B, are formed at the first area of the base 112 of the rack frame 110. The second pair of receiving holes, for example BH2 shown in FIG. 6B, are formed at the second area of the base 112 of the rack frame 110.

Referring to FIGS. 8B and 10B, in various embodiments, the top bracket 125 has a third pair of through-holes (not shown in drawings) configured to receive a third pair of fasteners 126. The third pair of fasteners 126 are fastened to a pair of receiving holes (not shown in drawings) formed at the upper end of the vertical frame 120. The top bracket 125 has a fourth pair of through-holes (not shown in drawings) configured to receive a fourth pair of fasteners 126. The fourth pair of fasteners 126 are fastened to a third pair of receiving holes (not shown in drawings) or a fourth pair of receiving holes (not shown in drawings) formed on the top side 111 of the rack frame 110. The third pair of receiving holes are formed at the first area of the top side 111 of the rack frame 110. The fourth pair of receiving holes are formed at the second area of the top side 111 of the rack frame 110. As noted above referring to FIG. 6B, the first area of the top side 111 has the third pair of receiving holes or bracket holes that corresponds to BH1, and the second area of the top side 111 has the fourth pair of receiving holes or bracket holes that corresponds to BH2. In various embodiments, all of the first pair, second pair, third pair, and fourth pair of fasteners 126 are the same. For example, the fasteners 126 include screws.

Referring to FIGS. 8A and 8B, the vertical frame 120 is in the first position when the second pair of fasteners 126 are fastened to the first pair of receiving holes, i.e., BH1 shown in FIG. 6B, formed on the base 112 of the rack frame 110 and when the fourth pair of fasteners 126 are fastened to the third pair of receiving holes or bracket holes corresponding to BH1, formed on the top side 111 of the rack frame 110.

Referring to FIGS. 10A and 10B, the vertical frame 120 is in the second position when the second pair of fasteners 126 are fastened to the second pair of receiving holes, i.e., BH2 shown in FIG. 6B, formed on the base 112 of the rack frame 110 and when the fourth pair of fasteners 126 are fastened to the fourth pair of receiving holes or bracket holes corresponding to BH2, formed on the top side 111 of the rack frame 110.

Referring to 7B, 7C, 10A, and 10B, in various embodiments, each of the plurality of vertical frames 120 has a first planar surface 180a; a second planar surface 180b extending from a first side edge of the first planar surface 180a; a third planar surface 180c extending from a second side edge of the first planar surface 180a; a top planar surface 180d perpendicularly extending from a top edge of the first planar surface 180a; and a bottom planar surface 180e perpendicularly extending from a bottom edge of the first planar surface 180a. The top planar surface 180d and the bottom planar surface 180e are parallel.

In various embodiments, a first angle between the first planar surface 180a and the second planar surface 180b is greater than 90 degrees and a second angle between the first planar surface 180a and the third planar surface 180c is greater than 90 degrees. In various embodiments, the first angle and the second angle are the same, and the second planar surface 180b and the third planar surface 180c are not parallel.

In various embodiments, the first planar surface 180a has a first plurality of mounting apertures arranged vertically, i.e., first specification holes 1SH shown in FIG. 7B. In general, the first plurality of mounting apertures 1SH is configured for coupling of the rail 140 to the rack frame 110 when the rack assembly 100 is in the first configuration. The second planar surface 180b has a second plurality of mounting apertures arranged vertically, i.e., second specification holes 2SH shown in FIG. 7B. In general, the second plurality of mounting apertures 2SH is configured for coupling of the rail 145 to the rack frame 110 when the rack assembly 100 is in the second configuration.

In various embodiments, the first plurality of mounting apertures 1SH are used to receive the first computing device 150, and the second plurality of mounting apertures 2SH are used to receive the second computing device 155. For example, the first computing device 150 has first specifications in accordance with a first industry standard, and the second computing device 155 has second specifications in accordance with a second industry standard. In general, the first industry standard is incompatible with the second industry standard. In various embodiments, a number of the first plurality of mounting apertures 1SH is less than a number of the second plurality of mounting apertures 2SH, as exemplified in FIG. 7A. A first size of each of the first plurality of mounting apertures 1SH is generally same. A second size of each of the second plurality of mounting apertures 2SH is generally same. The first size is greater than the second size. For example, see FIGS. 7A and 7B.

Referring to FIGS. 7B-7D and 6B, in various embodiments, each of the plurality of vertical frames 120 further has a plunger 121 coupled to the bottom planar surface 180c. The plunger 121 is configured to be inserted into one of two plunger receiving holes PPH1, PPH2 formed on the base 112 of the rack frame 110. The vertical frame 120 is in the first position when the plunger 121 is inserted into a first plunger receiving hole PPH1 and the vertical frame 120 is in the second position when the plunger 121 is inserted into a second plunger receiving hole PPH2.

Figure 7C:
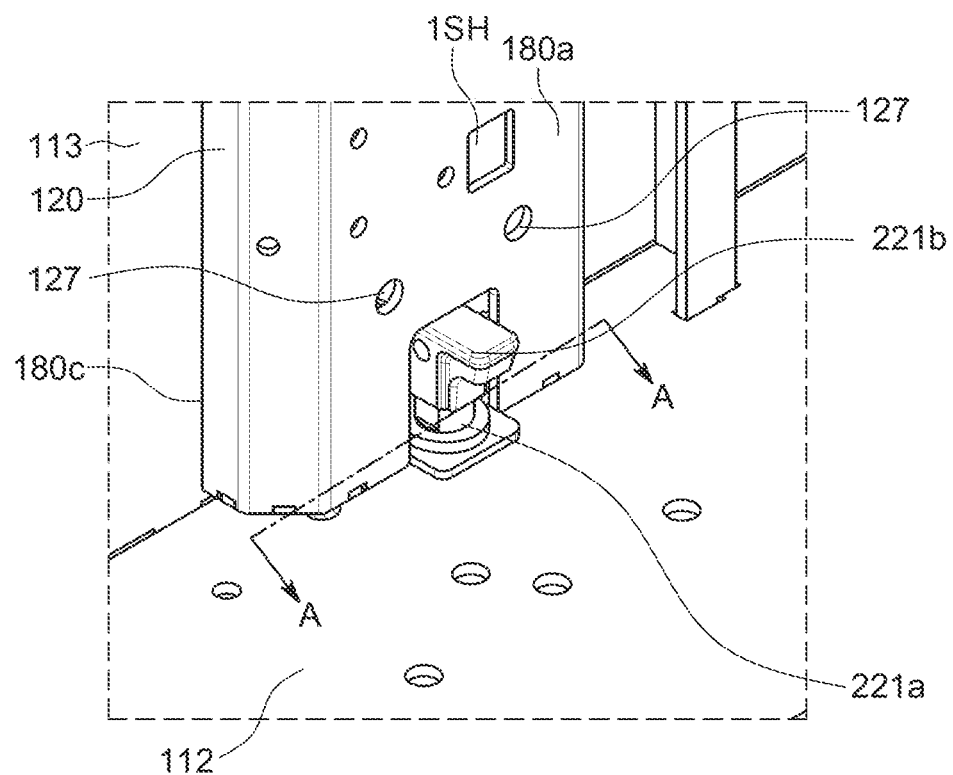
FIG. 7C shows a partial perspective view of a vertical frame in a rack assembly, according to certain aspects of the present disclosure.
Figure 7D:
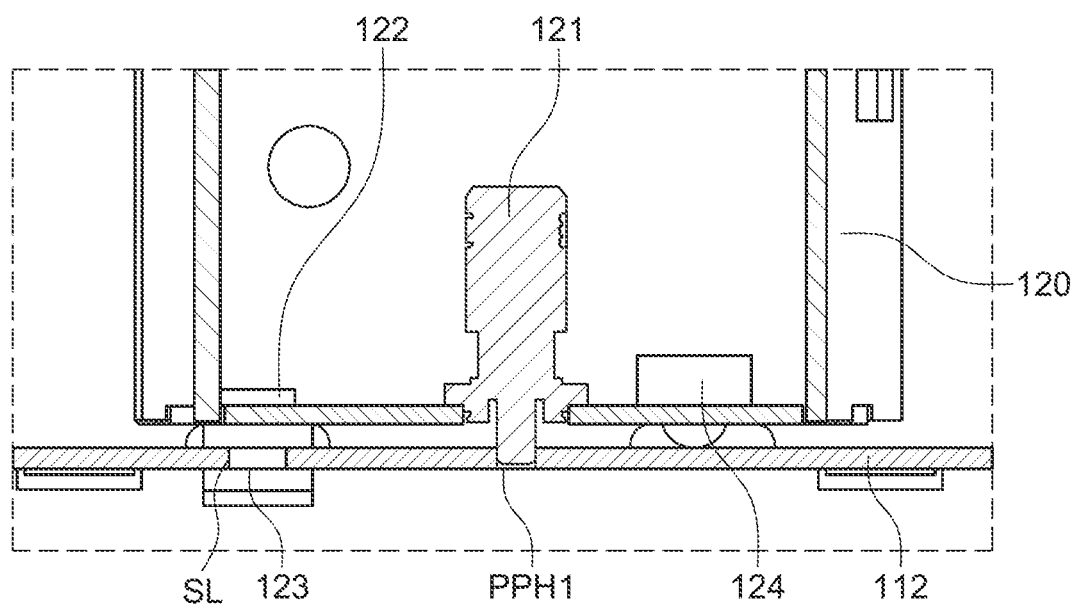
FIG. 7D shows a view of section A-A of the vertical frame shown in FIG. 7C, according to certain aspects of the present disclosure.

Further referring to FIGS. 7B-7D, in various embodiments, each of the plurality of vertical frames 120 further has a first axis 122 coupled to the bottom planar surface 180e, a first axis roller 123 coupled to the first axis 122, a second axis (not shown in drawings) coupled to the top planar surface 180d, and a second axis roller (not shown in drawings) coupled to the second axis. The base 112 of the rack frame 110 has a first elongated slot SL, as shown in FIG. 6B, the first elongated slot SL having a first position SL1 and a second position SL2. The top side 111 of the rack frame 110 has a second elongated slot (not shown in drawings), the second elongated slot having a first position and a second position. The second elongated slot corresponds to the first elongated slot SL formed on the base 112 of the rack frame 110. The first axis roller 123 is movable between the first position SL1 and the second position SL2 of the first elongated slot SL when the base bracket 125 is uncoupled from the lower end of the vertical frame 120 and the base 112 of the rack frame 110 and when the top bracket 125 is uncoupled from the upper end of the vertical frame 120 and the top side 111 of the rack frame 110. The second axis roller corresponding to the first axis roller 123 is movable between the first position and the second position of the second elongated slot when the base bracket 125 is uncoupled from the lower end of the vertical frame 120 and the base 112 of the rack frame 110 and when the top bracket 125 is uncoupled from the upper end of the vertical frame 120 and the top side 111 of the rack frame 110.

In various embodiments, the number of the vertical frame 120, which is generally made of metal and used to hold a rail and/or a server, in the rack frame 110 is 4. In various embodiments, the vertical frame 120 has one plunger 121, at the bottom planar surface 180e. However, in certain embodiments, the plunger 121 is at the top planar surface 180d instead of the bottom planar surface 180c. In certain embodiments, the vertical frame 120 has two plungers 121, one at the top planar surface 180d and the other at the bottom planar surface 180e. The plunger 121 limits movement of the vertical frame 120 in the rack frame 110 when the plunger 121 is in a locked position, i.e., when the plunger 121 is placed in PPH1 or PPH2 on the base 112 of the rack frame 110. In certain embodiments, the plunger 121 has a first part 221a made of metal and engaged with the base 112 of the rack frame 110 and a second part 221b coupled to the first part 221a and made generally of plastic. The second part 221b of the plunger 121 is shaped and configured to be held by fingers.

Referring to FIGS. 7B and 7D, in various embodiments, the vertical frame 120 further has one ball roller 124. The ball roller 124 is generally made of metal. The ball roller 124 is configured to support and assist movement of the vertical frame 120. In general, the ball roller 124 is coupled to the bottom planar surface 180e of the vertical frame 120. In various embodiments, the ball roller 124 is in contact with the base 112 of the rack frame 110. However, in certain embodiments, the ball roller 124 is coupled to the top planar surface 180d of the vertical frame 120 and in contact with the top side 111 of the rack frame 110. In certain embodiments, the vertical frame 120 has a pair of ball rollers 124, one at the bottom planar surface 180e and the other at the top planar surface 180d of the vertical frame 120. The ball roller 124 is configured to support movement of the vertical frame 120 when the vertical frame 120 is moved between the first position and the second position.

The vertical frame 120 further has a pair of axes, one being the first axis 122 coupled to the bottom planar surface 180e and the other being the second axis (not shown in drawings) coupled to the top planar surface 180d of the vertical frame 120. The axes 122 are made metal and configured to rotate the vertical frame 120, for example, when the vertical frame 120 is moved from the first position to the second position or vice versa. The vertical frame 120 further has the first axis roller 123 coupled to the first axis 122 and the second axis roller (not shown in drawings) coupled to the second axis. The axis rollers 123 are made of metal and configured to carry the axes 122 such that the vertical frame 120 is movable along the elongated slot SL.

In various embodiments, the vertical frame 120 is in the first position when the first axis roller 123 is at the first position SL1 of the first elongated slot SL, as exemplified in FIG. 8A, and when the second axis roller is at the first position of the second elongated slot, as exemplified in FIG. 8B. Further, the vertical frame 120 is in the second position when the first axis roller 123 is at the second position SL2 of the first elongated slot SL, as exemplified in FIGS. 10A, and when the second axis roller is at the second position of the second elongated slot, as exemplified in FIG. 10B.

According to other aspects of the present disclosure, a server system 200 is disclosed, as shown in FIG. 4. According to various embodiments, the server system 200 includes a rack assembly 100 configured to receive a plurality of computing devices including a first computing device 150 and a second computing device 155. For example, the first computing device 150, exemplified in FIG. 2A, has first specifications in accordance with a first industry standard and the second computing device 155, exemplified in FIG. 4, has second specifications in accordance with a second industry standard. In general, the first industry standard is incompatible with the second industry standard. The rack assembly 100 includes a rack frame 110 and a plurality of vertical frames 120 movably fixed to the rack frame 110. The plurality of vertical frames 120 are configured to attach any computing device of the plurality of computing devices 150, 155 to the rack frame 110. For example, in FIGS. 2A and 2B, the first computing devices 150 are attached to the vertical frames 120 of the rack assembly 100 that is in the first configuration. For example, in FIG. 4, the second computing devices 155 are attached to the vertical frames 120 of the rack assembly 100 that is in the second configuration. Each vertical frame 120 of the plurality of vertical frames is movably fixed to the rack frame 110 via a pair of brackets 125, as shown in FIG. 5. The pair of brackets 125 includes a base bracket 125 immovably coupling, in a respective locked position, a lower end of the vertical frame 120 to a base 112 of the rack frame 110, as shown in FIGS. 8A and 10A; and a top bracket 125 immovably coupling, in a respective locked position, an upper end of the vertical frame 120 to a top side 111 of the rack frame 110, as shown in FIGS. 8B and 10B. The vertical frame 120 is movable between a first position and a second position along the rack frame 110 when each of the base bracket 125 and the top bracket 125 is in a respective unlocked position, as exemplified in FIGS. 9A-9E. The first position accommodates the first specifications of the first industry standard and the second position accommodates the second specifications of the second industry standard.

Referring to FIGS. 6B, 7B, and 7D, in various embodiments, each of the base 112 and the top side 111 of the rack frame 110 has an elongated slot SL within which an axis roller 123 coupled to the vertical frame 120 is movable. The vertical frame 120 is in the first position when the axis roller 123 is at a first position SL1 of the slot SL, and the vertical frame 120 is in the second position when the axis roller 123 is at a second position SL2 of the slot SL.

Further, in various embodiments, each of the plurality of vertical frames 120 has a plunger 121 configured to be inserted into one of two plunger receiving holes PPH1, PPH2 formed on the base 112 of the rack frame 110 such that the vertical frame 120 is in the first position when the plunger 121 is inserted into a first plunger receiving hole PPH1 and the vertical frame 120 is in the second position when the plunger 121 is inserted into a second plunger receiving hole PPH2.

Furthermore, in various embodiments, each of the plurality of vertical frames 120 further has a ball roller 124 couple to the vertical frame 120 and configured to support movement of the vertical frame 120 when the vertical frame 120 is moved between the first position and the second position. The ball roller 124 contacts the base 112 of the rack frame 110.

Figure 9A:
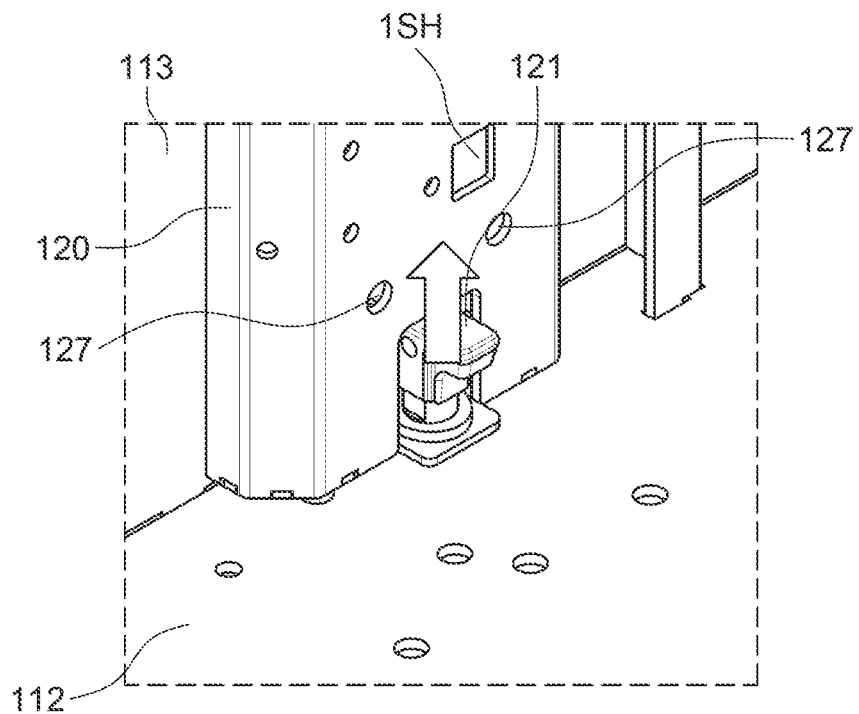
FIGS. 9A-9E each show a step for moving a vertical frame in a rack frame from a first position to a second position, according to certain aspects of the present disclosure.
Figure 9B:
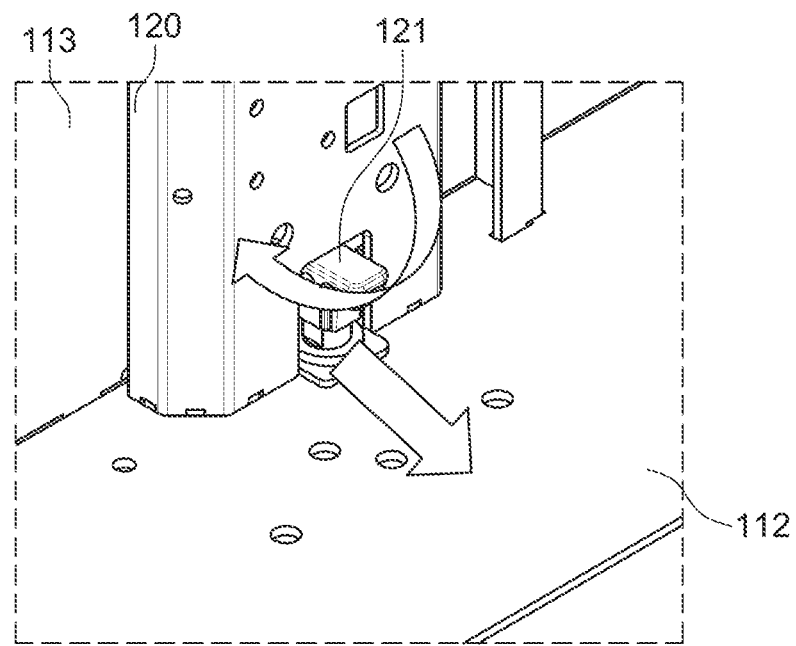
Figure 9C:
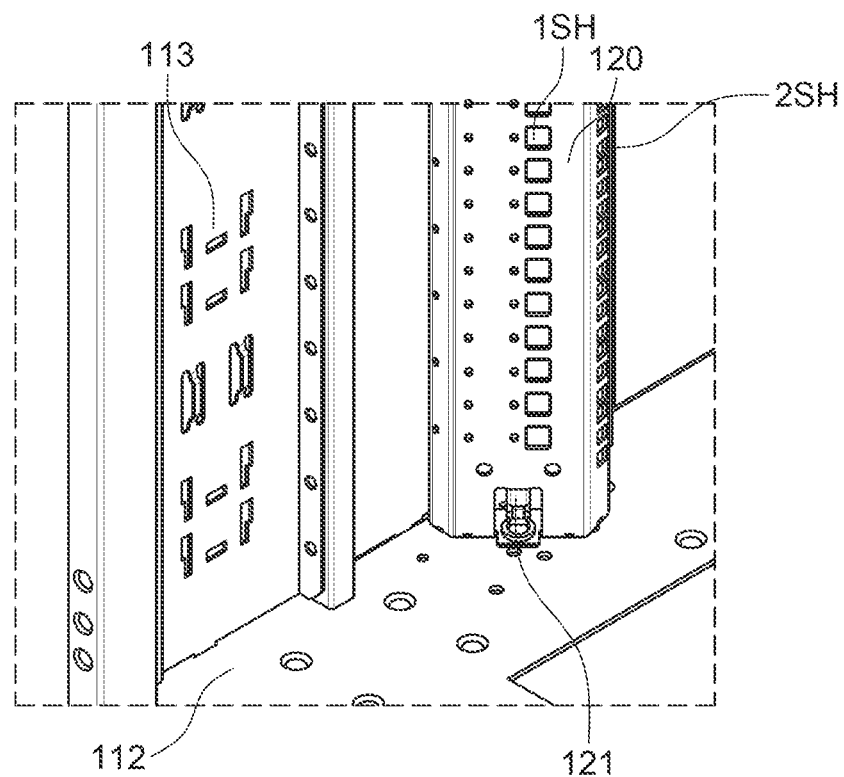
Figure 9D:
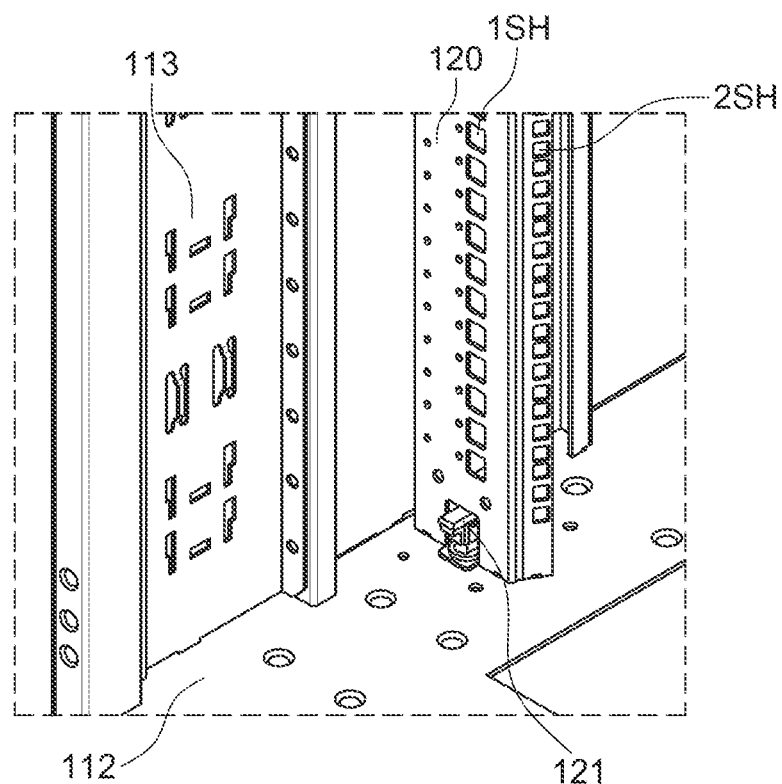
Figure 9E:
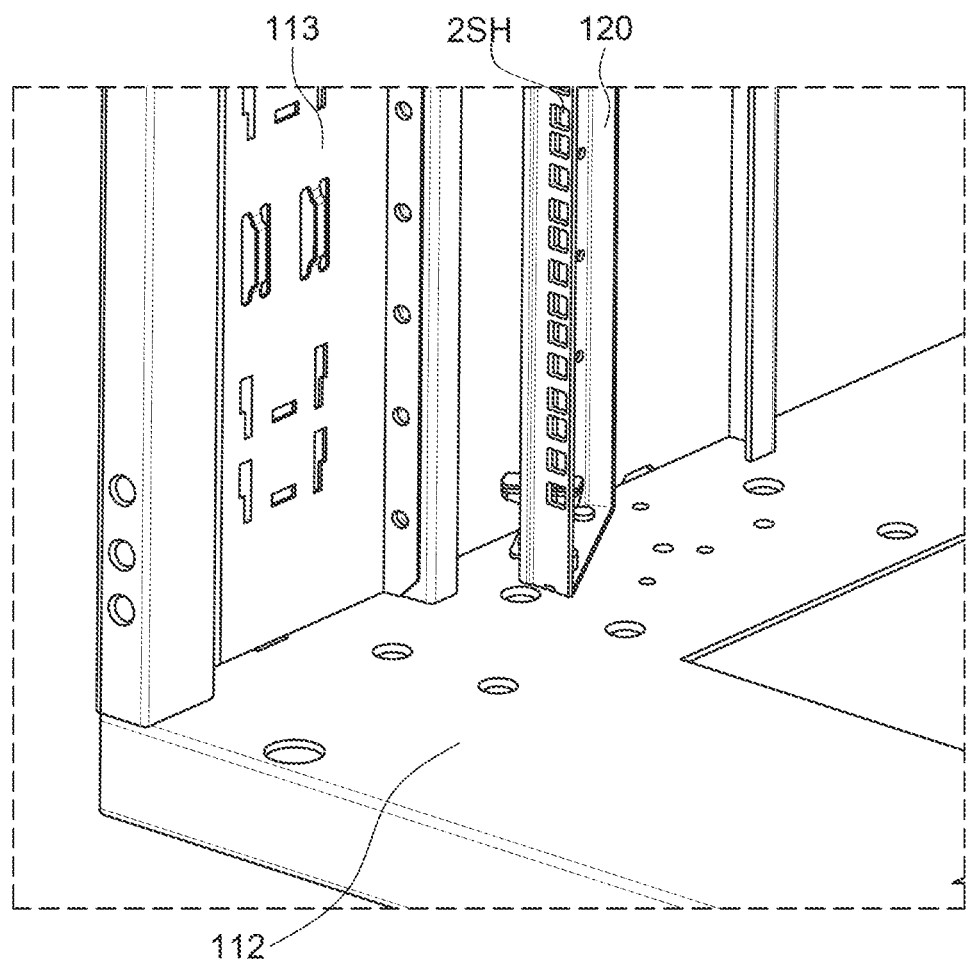

FIGS. 9A-9E show a mechanism of moving a vertical frame in a rack frame from a first position to a second position, according to certain aspects of the present disclosure. In FIG. 9A, the vertical frame 120 is in the first position and in FIG. 9E, the vertical frame 120 is in the second position. In some embodiments, the vertical frame 120 is in contact with the left side 113 or right side 114 of the rack frame 110. To move the vertical frame 120 from the first position to the second position, first, the plunger 121 is raised or pulled such that the plunger 121 is out of the first plunger receiving hole PPH1, as shown in FIG. 9A. And then, the vertical frame 120 is moved toward the inner space of the rack frame 110 such that the axis roller 123 is moved along the slot SL from the first position SL1 to the second position SL2. Then, the vertical frame 120 is rotatable as shown in FIG. 9B. For example, the moved vertical frame 120 that was initially in contact with the left side 113 of the rack frame 110 rotates clockwise. The clockwise movement of the vertical frame 120 is as shown in FIGS. 9C, 9D, and 9E in order. For example, the vertical frame 120 rotates more than 90 degrees, but less than 180 degrees. Thus, the portions of the vertical frame 120, which were initially in contact with the left side 113 of the rack frame 110 when the vertical frame 120 was in the first position, are no longer in contact with the left side 113. In some embodiments, the vertical frame 120, which is in the second position, as exemplified in FIG. 9E, is no longer in contact with the left side 113 of the rack frame 110. The plunger 121 is placed in the second plunger receiving hole PPH2 to place the vertical frame 120 in the second position. Finally, the base bracket 125 is attached to the lower end of the vertical frame 120 that is in the second position and to the second bracket holes BH2 on the base 112 of the rack frame 110 to fix the vertical frame 120 in the second position, as shown in FIG. 10A. The top bracket 125 is also attached to the upper end of the vertical frame 120 that is in the second position and to the corresponding bracket holes on the top side 111 of the rack frame 110 to fix the vertical frame 120 in the second position, as shown in FIG. 10B. The vertical frame 120 that is in the second position allows the second specification holes 2SH formed on the vertical frame 120 to receive the rails 145. Once the rails 145 are attached to the vertical frame 120 that is in the second position, the rails 145 are configured to receive the second computing devices 155. See FIG. 4.

Moving the vertical frame 120 in the rack frame 110 from the second position to the first position can be performed, as shown in FIGS. 9E, 9D, 9C, 9B, and 9A in order. The base and top brackets 125 need to be decoupled from the vertical frame 120 and the base 112 of the rack frame 110 prior to the performance shown in FIGS. 9E-9A. It is noted that the brackets 125 are attached to different sides of the vertical frame 120 when the vertical frame 120 is in the first position and when the vertical frame 120 is in the second position. See FIGS. 8A-8B and FIGS. 10A-10B, respectively.

According to other aspects of the present disclosure, a rack assembly 100 for a computing system is disclosed. Referring to FIGS. 1A, 1B, 3A and 3B, the rack assembly 100 includes a rack frame 110 having a top side 111, a base 112, a front, a rear, and opposing left side 113 and right side 114. The front and rear sides of the rack frame 110 are mostly empty, as shown in FIGS. 1B and 3B. The rack assembly 100 further includes a vertical frame 120 movably fixed within the rack frame 110 and a pair of brackets 125. The pair of brackets 125 includes a base bracket 125 removably coupled to a lower end of the vertical frame 120 and the base 112 of the rack frame 110; and a top bracket 125 removably coupled to an upper end of the vertical frame 120 and the top side 111 of the rack frame 110. See FIGS. 8A, 8B, 10A, and 10B. The vertical frame 120 is movable between a first position and a second position when the pair of brackets 125 are uncoupled from the vertical frame 120 and the rack frame 110, as exemplified in FIGS. 9A-9E. The base 112 of the rack frame 110 has a first hole PPH1 configured to place the vertical frame 120 in the first position and a second hole PPH2 configured to place the vertical frame 120 in the second position, as shown in FIG. 6B. The rack assembly 100 is configured to receive a first type of computing device 150 when the vertical frame 120 is in the first position, as exemplified in FIGS. 2A and 2B and receive a second type of computing device 155 when the vertical frame 120 is in the second position, as exemplified in FIG. 4.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

As discussed above, no additional components are required for switching the configuration of the rack assembly 100 between the first and second configurations. All that is required for switching the configuration is simply re-positioning the vertical frame 120 by manipulating the existing components of the configurable rack assembly 100. Therefore, there is no need for storing additional components or parts to reconfigure the rack assembly 100. Further, the reconfiguration of the rack assembly 100 can be done easily and quickly. Thus, the rack assembly 100 can be used to store various types of computing devices or servers.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A rack assembly for a computing system, the rack assembly comprising:
   a rack frame configured to receive a plurality of computing devices, the plurality of computing devices including a first computing device and a second computing device, the first computing device having first specifications in accordance with a first industry standard, the second computing device having second specifications in accordance with a second industry standard, the first industry standard being incompatible with the second industry standard; and
   a plurality of vertical frames movably fixed to the rack frame, the plurality of vertical frames being configured to attach any computing device of the plurality of computing devices to the rack frame, each vertical frame of the plurality of vertical frames being movably fixed to the rack frame via a pair of brackets, the pair of brackets including
      a base bracket immovably coupling, in a respective locked position, a lower end of the vertical frame to a base of the rack frame, and
      a top bracket immovably coupling, in a respective locked position, an upper end of the vertical frame to a top side of the rack frame;
   wherein:
   the vertical frame is movable between a first position and a second position along the rack frame when each of the base bracket and the top bracket is in a respective unlocked position;
   in the first position, at least one mounting aperture couples a first width of the first specifications of the first industry standard, and in the second position, at least one mounting aperture couples a second width, different from the first width, of the second specifications of the second industry standard;
   each of the base and the top side of the rack frame has an elongated slot within which an axis roller coupled to the vertical frame is movable, the vertical frame being in the first position when the axis roller is at a first position of the slot, and the vertical frame being in the second position when the axis roller is at a second position of the slot; and
   each of the plurality of vertical frames has a plunger configured to be inserted into one of two plunger receiving holes formed on the base of the rack frame such that the vertical frame is in the first position when the plunger is inserted into a first plunger receiving hole and the vertical frame is in the second position when the plunger is inserted into a second plunger receiving hole.

2. The rack assembly of claim 1, wherein:
   the vertical frame is in the first position when the base bracket is coupled to a first area of the base of the rack frame and when the top bracket is coupled to a first area of the top side of the rack frame; and
   the vertical frame is in the second position when the base bracket is coupled to a second area of the base of the rack frame and when the top bracket is coupled to a second area of the top side of the rack frame.

3. The rack assembly of claim 2, wherein:
   the base bracket has a first pair of through-holes configured to receive a first pair of fasteners;
   the first pair of fasteners are fastened to a pair of receiving holes formed at the lower end of the vertical frame; and
   the base bracket has a second pair of through-holes configured to receive a second pair of fasteners.

4. The rack assembly of claim 3, wherein:
the second pair of fasteners are fastened to a first pair of receiving holes or a second pair of receiving holes formed on the base of the rack frame;
the first pair of receiving holes are formed at the first area of the base of the rack frame; and
the second pair of receiving holes are formed at the second area of the base of the rack frame.

5. The rack assembly of claim 4, wherein:
the top bracket has a third pair of through-holes configured to receive a third pair of fasteners;
the third pair of fasteners are fastened to a pair of receiving holes formed at the upper end of the vertical frame;
the top bracket has a fourth pair of through-holes configured to receive a fourth pair of fasteners.

6. The rack assembly of claim 5, wherein:
the fourth pair of fasteners are fastened to a third pair of receiving holes or a fourth pair of receiving holes formed on the top side of the rack frame;
the third pair of receiving holes are formed at the first area of the top side of the rack frame; and
the fourth pair of receiving holes are formed at the second area of the top side of the rack frame.

7. The rack assembly of claim 6, wherein the vertical frame is in the first position when the second pair of fasteners are fastened to the first pair of receiving holes formed on the base of the rack frame and when the fourth pair of fasteners are fastened to the third pair of receiving holes formed on the top side of the rack frame.

8. The rack assembly of claim 7, wherein the vertical frame is in the second position when the second pair of fasteners are fastened to the second pair of receiving holes formed on the base of the rack frame and when the fourth pair of fasteners are fastened to the fourth pair of receiving holes formed on the top side of the rack frame.

9. The rack assembly of claim 1, wherein each of the plurality of vertical frames has:
a first planar surface;
a second planar surface extending from a first side edge of the first planar surface;
a third planar surface extending from a second side edge of the first planar surface;
a top planar surface perpendicularly extending from a top edge of the first planar surface; and
a bottom planar surface perpendicularly extending from a bottom edge of the first planar surface, and
wherein the top planar surface and the bottom planar surface are parallel.

10. The rack assembly of claim 9, wherein a first angle between the first planar surface and the second planar surface is greater than 90 degrees and a second angle between the first planar surface and the third planar surface is greater than 90 degrees such that the second planar surface and the third planar surface are not parallel.

11. The rack assembly of claim 9, wherein:
the first planar surface has a first plurality of mounting apertures arranged vertically, the first plurality of mounting apertures being configured for coupling of a rail to the rack frame; and
the second planar surface has a second plurality of mounting apertures arranged vertically, the second plurality of mounting apertures being configured for coupling of a rail to the rack frame.

12. The rack assembly of claim 11, wherein the first plurality of mounting apertures are used to receive the first computing device, and the second plurality of mounting apertures are used to receive the second computing device.

13. The rack assembly of claim 11, wherein:
a number of the first plurality of mounting apertures is less than a number of the second plurality of mounting apertures;
a first size of each of the first plurality of mounting apertures is same;
a second size of each of the second plurality of mounting apertures is same; and
the first size is greater than the second size.

14. The rack assembly of claim 9, wherein:
each of the plurality of vertical frames further has a first axis coupled to the bottom planar surface, a first axis roller coupled to the first axis, a second axis coupled to the top planar surface, and a second axis roller coupled to the second axis;
the base of the rack frame has a first elongated slot, the first elongated slot having the first position and the second position;
the top of the rack frame has a second elongated slot, the second elongated slot having the first position and the second position;
the first axis roller is movable between the first position and the second position of the first elongated slot when the base bracket is uncoupled from the lower end of the vertical frame and the base of the rack frame and when the top bracket is uncoupled from the upper end of the vertical frame and the top side of the rack frame; and
the second axis roller is movable between the first position and the second position of the second elongated slot when the base bracket is uncoupled from the lower end of the vertical frame and the base of the rack frame and when the top bracket is uncoupled from the upper end of the vertical frame and the top side of the rack frame.

15. The rack assembly of claim 14, wherein:
the vertical frame is in the first position when the first axis roller is at the first position of the first elongated slot and when the second axis roller is at the first position of the second elongated slot; and
the vertical frame is in the second position when the first axis roller is at the second position of the first elongated slot and when the second axis roller is at the second position of the second elongated slot.

16. The rack assembly of claim 15, wherein each of the plurality of vertical frames further has a ball roller couple to the bottom planar surface and configured to support movement of the vertical frame when the vertical frame is moved between the first position and the second position, the ball roller contacting the base of the rack frame.

17. A server system comprising a rack assembly configured to receive a plurality of computing devices including a first computing device and a second computing device, the first computing device having first specifications in accordance with a first industry standard, the second computing device having second specifications in accordance with a second industry standard, the first industry standard being incompatible with the second industry standard, wherein the rack assembly comprises:
a rack frame; and
a plurality of vertical frames movably fixed to the rack frame, the plurality of vertical frames being configured to attach any computing device of the plurality of computing devices to the rack frame, each vertical frame of the plurality of vertical frames being movably fixed to the rack frame via a pair of brackets, the pair of brackets including
  a base bracket immovably coupling, in a respective locked position, a lower end of the vertical frame to a base of the rack frame; and
  a top bracket immovably coupling, in a respective locked position, an upper end of the vertical frame to a top side of the rack frame,
wherein:
the vertical frame is movable between a first position and a second position along the rack frame when each of the base bracket and the top bracket is in a respective unlocked position;
in the first position, at least one mounting aperture couples a first width of the first specifications of the first industry standard, and in the second position, at least one mounting aperture couples a second width, different from the first width, of the second specifications of the second industry standard;
each of the base and the top side of the rack frame has an elongated slot within which an axis roller coupled to the vertical frame is movable, the vertical frame being in the first position when the axis roller is at a first position of the slot, and the vertical frame being in the second position when the axis roller is at a second position of the slot; and
each of the plurality of vertical frames has a plunger configured to be inserted into one of two plunger receiving holes formed on the base of the rack frame such that the vertical frame is in the first position when the plunger is inserted into a first plunger receiving hole and the vertical frame is in the second position when the plunger is inserted into a second plunger receiving hole.

18. The server system of claim 17, wherein
each of the plurality of vertical frames further has a ball roller couple to the vertical frame and configured to support movement of the vertical frame when the vertical frame is moved between the first position and the second position, the ball roller contacting the base of the rack frame.

* * * * *